United States Patent [19]

Steenblik et al.

[11] Patent Number: 5,503,902

[45] Date of Patent: Apr. 2, 1996

[54] LIGHT CONTROL MATERIAL

[75] Inventors: Richard A. Steenblik, Atlanta; Mark J. Hurt, Alpharetta, both of Ga.

[73] Assignee: Applied Physics Research, L.P., Roswell, Ga.

[21] Appl. No.: 204,489

[22] Filed: Mar. 2, 1994

[51] Int. Cl.$^6$ ........................................ B32B 3/00
[52] U.S. Cl. .................. 428/172; 428/141; 428/156; 428/913; 430/13; 430/14; 430/16
[58] Field of Search ................... 428/167, 172, 428/178, 156, 166, 68, 137, 141, 143, 913; 430/13, 14, 16

[56] References Cited

U.S. PATENT DOCUMENTS

| | | | |
|---|---|---|---|
| 2,587,594 | 3/1952 | Chavennes et al. | 428/167 |
| 2,691,585 | 10/1954 | Yule et al. | 95/8 |
| 4,013,465 | 3/1977 | Clapham et al. | 96/36 |
| 4,025,673 | 5/1977 | Reinnagel | 428/29 |
| 4,124,947 | 11/1978 | Kuhl et al. | 40/453 |
| 4,127,693 | 11/1978 | Lemelgun | 428/163 |
| 4,269,915 | 5/1981 | Moraw | 430/11 |
| 4,403,031 | 9/1983 | Barrelli et al. | 430/332 |
| 4,668,558 | 5/1987 | Barber | 428/156 |
| 4,705,356 | 11/1987 | Berning et al. | 350/166 |
| 5,004,673 | 4/1991 | Vlannes | 430/325 |
| 5,087,507 | 2/1992 | Heinzer | 428/195 |
| 5,204,160 | 4/1993 | Rousel | 428/167 |
| 5,210,801 | 5/1993 | Fournier et al. | 385/14 |
| 5,217,932 | 6/1993 | Joslin et al. | 430/7 |

FOREIGN PATENT DOCUMENTS 638039  7/1989  Japan.

*Primary Examiner*—Donald J. Loney
*Attorney, Agent, or Firm*—Deveau, Colton & Marquis

[57] ABSTRACT

A light control material for displaying black-and-white and color images by forming light traps in a layer of photopolymer at selected locations. The photopolymer layer constitutes a master from which embossments can be produced. An embossment which displays the image can be produced from the master by a soft embossing procedure. The light traps are formed in the master by reactively ion etching a layer of cured photopolymer at selected locations to create fields of tapered structures. An embossment generated from the master contains fields of tapered structures which correspond to those created in the master. The surface of the embossment which includes the fields of tapered structures is coated with a reflective material such as metal. Light which enters the fields is reflected within the fields of tapered structures until substantially all of the light has been absorbed. Light which does not enter the fields is reflected. The light traps correspond to the black areas of a black-and-white image whereas the reflective areas correspond to the white areas of the black- and-white image.

19 Claims, 4 Drawing Sheets

LIGHT CONTROL MATERIAL

The present invention relates to a method for selectively forming light traps in a light control material and, more particularly, to a method for creating black-and-white images by selectively forming light traps in a polymer material. In addition, the method of the present invention enables the black-and-white images to be generated as embossments from a master. Furthermore, the method of the present invention enables high resolution color images to be generated by combining a high resolution black and white embossed image with a lower resolution color printed image.

In general, the present invention utilizes photolithographic techniques to form light traps in a layer of material. The light traps are formed by reactively ion etching the material, which is preferably a hardened layer of photopolymer. It has been discovered that by reactively ion etching cured photopolymer with a reactive gas such as oxygen, tapered structures are created which have large height-to-width or aspect ratios. It is believed that these structures occur because of impurities or inclusions in the composition of the photopolymer. When the structures are covered with a reflective layer of metal, light which enters the light traps is reflected among the tapered structures until substantially all of the light has been absorbed.

The high aspect ratios of the structures cause light entering the light traps to be reflected at very shallow angles. Depending on the reflective characteristics of the surfaces of the structures, as much as 40% of the light may be absorbed on each reflection.

By using photolithographic techniques, these light traps can be selectively formed at precise locations in the cured layer of photopolymer. As discussed in detail below, this method allows high resolution black-and-white images to be created. Furthermore, this method provides for the creation of a master from which embossments can be produced which display the particular black-and-white image formed in the master. In addition, this method allows high resolution color images to be created by combining a high resolution black-and-white embossed image with a lower resolution color printed image.

Until the present invention, it was not known that images could be formed in a layer of material by reactively ion etching the material to form light traps in selected areas in the material. Although methods are known which utilize various techniques to replicate images, none of the known methods utilize the methods or concepts introduced by the present invention.

F. G. Yanes, U.S. Pat. No. 2,374,910, discloses a method for making molds for printing surfaces. A plate is covered with a layer of emulsion which is exposed through an original half-tone image photographic negative. The plate is then etched such that areas which correspond to "whites" in the original image are not etched and areas which correspond to darker areas in the original image are etched more than others. A cast is then produced from the mold which, when inked and printed, will produce a half-tone image which corresponds to the original half-tone image.

Kinney, U.S. Pat. No. 3,607,273, discloses forming a black-and-white image by covering a black substrate with a thin layer of foaming agent and exposing the substrate and foaming agent to radiant energy through a photographic positive. The areas of the foaming agent which are subjected to the radiant energy swell and create light scattering surfaces which reflect light. The foaming agent is clear in the unfoamed state. The reflective areas correspond to white areas in the photographic positive and the areas in which the black substrate can be seen correspond to black areas in the photographic positive.

Fotland, et al., U.S. Pat. No. 4,920,039, discloses a method of providing images on the flat surface of a lenticular sheet. An image layer is formed on the flat surface of a lenticular sheet. The image layer consists of a cross-linkable polymer which undergoes a chemical change upon exposure to collimated radiation from an ultraviolet source. The image layer is selectively cured by exposing only certain portions of the image layer to ultraviolet light. The unexposed areas of the image layer are rinsed away. When the material is used as a package an image can be seen from a particular range of angles while from other angles the lenticular sheet is clear and the interior contents of the package may be seen.

SUMMARY OF THE INVENTION

In accordance with the present invention, a black-and-white image can be formed in a polymer layer of material by first using photolithographic techniques to expose selected areas in the polymer layer and then reactively ion etching the exposed areas of the polymer layer to form light traps in the selected areas. Color images can also be created by first creating a black-and-white image in a polymer layer and then overlaying the polymer layer with additive or subtractive color transparencies.

Accordingly, it is an object of the present invention to create an embossed light control material which displays black-and-white or color images. The embossed light control material is produced from a master which has light traps selectively formed therein by reactive ion etching.

It is another object of the present invention to provide a new and useful method for reproducing photographic images in a light control material from which embossments can be generated which also display the images.

It is another object of the present invention to provide a new and useful method for converting black-and-white images into color images.

It is yet another object of the present invention to provide a light control material which displays a replicate of a photographic image with enhanced brightness.

It is a further object of the present invention to provide an inexpensive and convenient means for replicating photographic images.

It is an even further object of the present invention to provide a method for creating an image in a light control material in accordance with a computer generated mask.

It is another object of the present invention to produce high resolution black-and-white and color images.

It is another object of the present invention to create embossed light control materials for displaying black and white or color images which operate in the reflective or transmissive modes.

These and other objects of the present invention will become apparent from the detailed description of the invention provided below.

BRIEF DESCRIPTION OF THE INVENTION

Figure 10A:
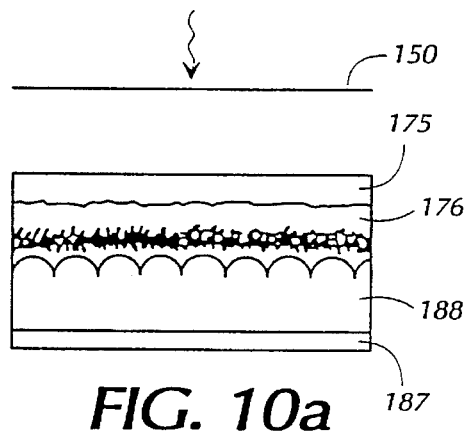
Figure 10B:
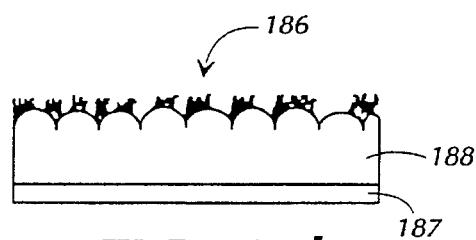
Figure 11:
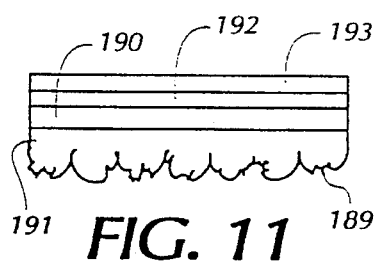

FIGS. 10a and 10b illustrate an alternative embodiment for creating an embossed light control material which displays a black-and-white image; and FIG. 11 illustrates a cross-sectional view of the embossed light control material of the present invention which has a black-and-white image formed therein. The black-and-white image is converted into a color image by overlaying the embossment with additive or subtractive color transparencies.

Figure 12:
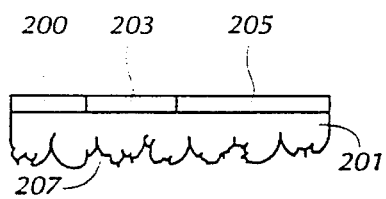

FIG. 12 illustrates an alternative embodiment for converting a black and white image into a color image.

Figure 13A:
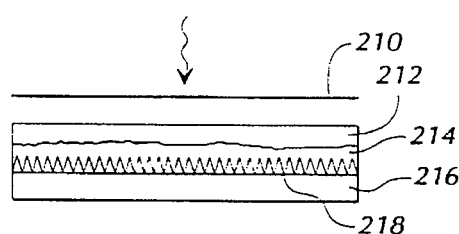
Figure 13B:
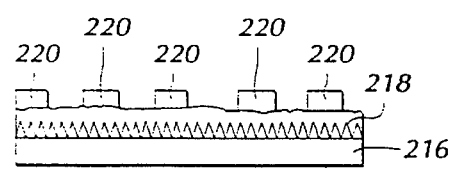
Figure 13C:
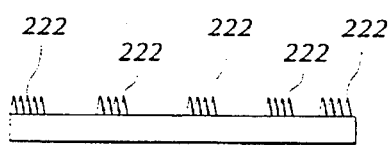

FIGS. 13a–13c illustrate an alternative embodiment for creating the light control material of the present invention wherein the light control material is intended to operate in the transmissive mode.

Figure 14:
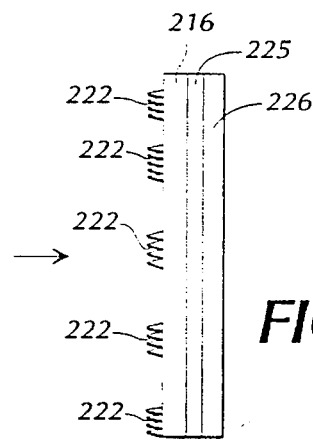

FIG. 14 illustrates a light control material for displaying color images which operates in the transmissive mode.

DETAILED DESCRIPTION OF THE INVENTION

Figure 1A:
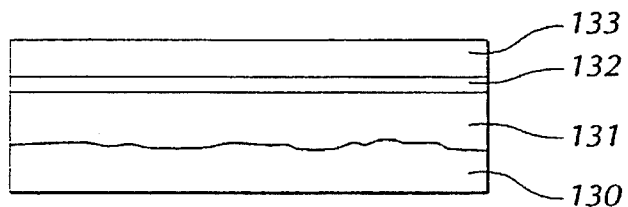
FIGS. 1a–1e illustrate a preferred method of the present invention for creating light traps in a master and for generating an embossment from the master.
Figure 1B:
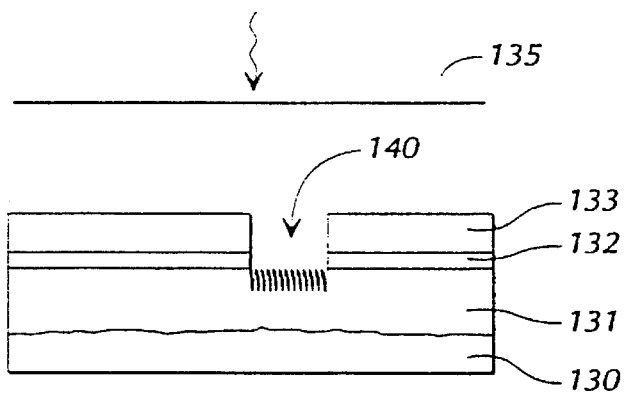
Figure 1C:
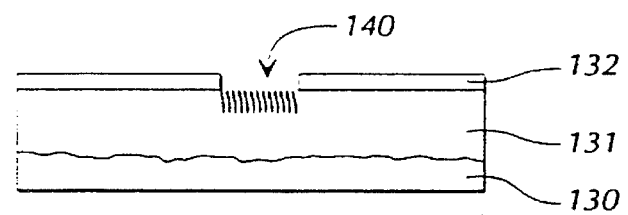

FIGS. 1a through 1c illustrate the preferred method for creating the light traps in the master. A cured layer of photopolymer 131 is bonded to substrate 130, such as, for example, glass or quartz. Photopolymer 131 is coated with a thin layer of metal such as chrome 132. The layer of chrome 132 is coated with a layer of photoresist 133. As shown in FIG. 1b, the photoresist layer 133 is exposed to ultraviolet light through a mask 135. The exposed photoresist is then developed away such that the layer of chrome 132 is exposed in the position where the photoresist has been removed. The chrome is then etched by an acid bath to expose the cured photopolymer 131. The photopolymer is then etched in a reactive ion etcher which preferably utilizes oxygen as the reactive gas.

Figure 6:
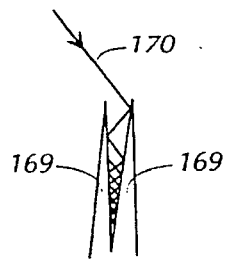
FIG. 6 is a cross-sectional illustration of the tapered structures of the light traps of the present invention.

It has been discovered that due to the impurities in the composition of the cured photopolymer, the reactive ion etching process creates stalagtite-type or tapered structures 140 in the photopolymer which have high height- to-width, or aspect ratios. The dimensions of the tapered structures are typically on the order of $0.5\mu$ to $4\mu$ in height and $0.1\mu$ to $2\mu$ in width. The high aspect ratios cause light which enters the light traps to be reflected at very shallow angles. Each time light which enters the light trap is reflected, approximately 10% of the light may be absorbed. Due to the shape of the structures, light is reflected many times before there is a chance for the light to be reflected back out of the light trap. Since approximately 10% of the light may be absorbed each time the light is incident upon the structures, virtually all of the light that enters the light trap is absorbed. FIG. 6 illustrates how the light trap works. As light 170 enters the light trap, it is reflected by the tapered structures 169 until all of the light has been absorbed. Approximately 40% of the light may be absorbed on initial impact. Therefore, it takes very few reflections before substantially all of the light has been absorbed.

As shown in FIG. 1c, once the light trap has been created, the photoresist layer is completely removed, leaving a layer of chrome covering everything except the light trap 140. The purpose of the chrome is to protect the photopolymer during the reactive ion etching process in areas where it is undesirable to create light traps. Once the light trap has been created, the device shown in FIG. 1c can be used as a master for making embossments.

Figure 1D:
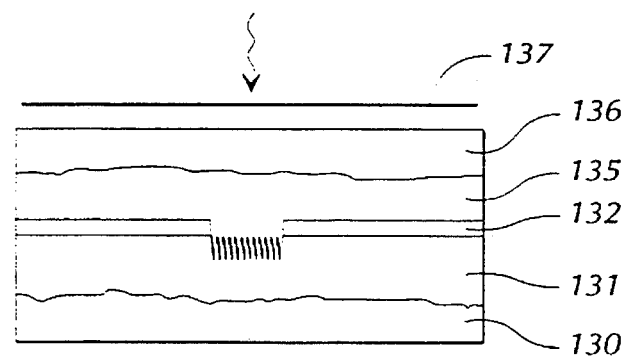
Figure 1E:
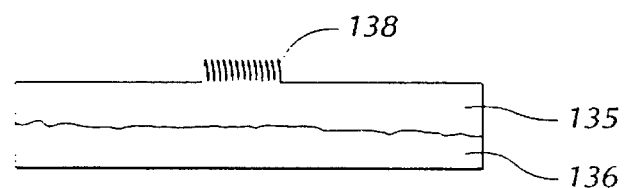

FIG. 1d illustrates how an embossment is made from the master by using a soft embossing procedure. A glass substrate 136 is placed in contact with liquid photopolymer 135 which is in contact with the master of FIG. 1c. Ultraviolet light is then projected onto the entire structure. The photopolymer becomes hardened or cured by the ultraviolet light. The result is the embossment shown in FIG. 1e. The embossment is then preferably coated with a reflective metal such as aluminum, preferably by evaporative coating.

The present invention is capable of operating in the reflective or transmissive modes, as discussed in further detail below. In the reflective mode, which is the preferred embodiment, the embossment is coated with a reflective layer of metal. However, it is also possible to use other materials, such as a metallic paint, or any pigment or ink which exhibits specularly reflective properties. In the transmissive mode, it is unnecessary to coat the embossment with a reflective layer of metal. However, when the embossment is intended to operate in the transmissive mode, it is possible to coat only the light traps with a reflective layer of metal in order to enhance their light-absorbing characteristics.

Figure 2A:
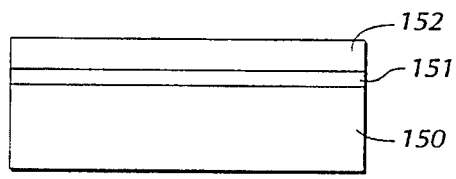
FIGS. 2a–2g illustrate one embodiment for creating a master having a continuous pattern of domed-shaped elements formed therein and for generating an embossment from the master.
Figure 2B:
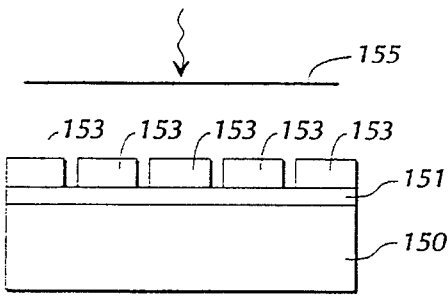
Figure 2C:
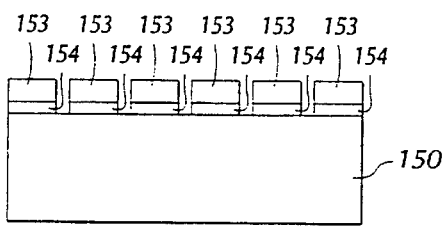
Figure 2D:
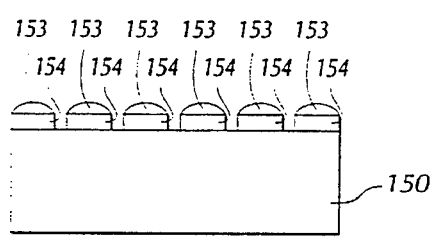
Figure 2E:
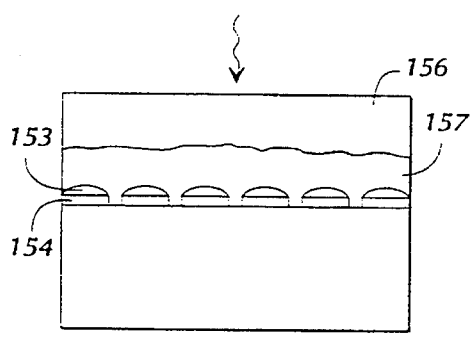
Figure 2F:
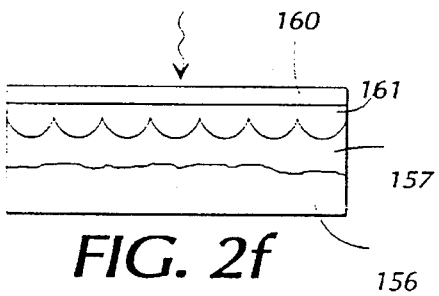
Figure 2G:
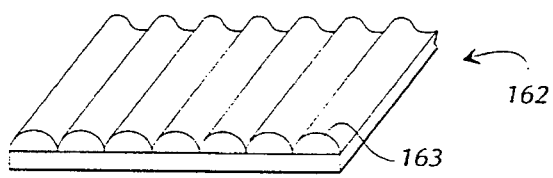
Figure 3:
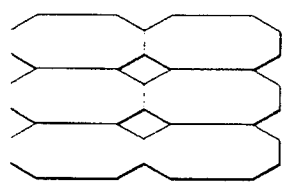
FIG. 3 illustrates a top view of hexagonal elements which have arcuate-shaped top surfaces and which may be used to create the light control material of the present invention.
Figure 4:
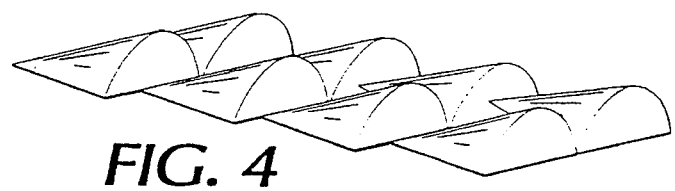
FIG. 4 illustrates an isometric view of truncated conical-shaped elements which may be used to create the light control material of the present invention.

FIGS. 2a–2g show a preferred embodiment for creating a master. The structure is designed to enhance the brightness of an image which has been formed therein by reactively ion etching selected areas as discussed below with respect to FIGS. 3a–3c. The structure for enhancing brightness comprises a plurality of tiny focusing elements 163 as shown in FIG. 2g. The device is capable of maximizing the brightness reflected from the inside of the structure while controlling the amount of specular and diffuse reflection off of the surface. However, the shapes of the focusing elements are not limited to the arcuate shapes shown in FIG. 2g. Other shapes may also be used. For example, the method discussed with respect to FIGS. 2a–2f may be used to create the hexagonal-shaped focusing elements shown in FIG. 3 or the truncated conical-shaped focusing elements shown in FIGS. 2g, 3 and 4 are all arcuate in shape across their top surfaces. Each of these shapes will enhance the brightness of an image formed in the embossment over a particular range of viewing angles.

The arcuate-shaped focusing elements "re-image" the source of the light impinging thereon and provide a minimum field of view which is independent of the angular extent of the source of the light. The overall field of view provided by a particular focusing element is dependent upon the geometry of the focusing element and the angular extent of the light source. By controlling the minimum field of view of the focusing elements, the overall field of view can be controlled. This allows light to be reflected and concentrated over a particular range of viewing angles which in turn allows the black and white or color image to be enhanced over the range of viewing angles.

The preferred embodiment for creating the master will now be described with respect to FIGS. 2a–2g. FIG. 2a illustrates a substrate 150 which is covered by a layer of chrome 151. On top of the layer of chrome 151 is a layer of photoresist 152. A mask 155 is placed over the structure as shown in FIG. 2b. The structure is then exposed to ultraviolet light. Clear areas in mask 155 correspond to areas in the photoresist which will be exposed to the ultraviolet light and subsequently developed away. This creates pads of photoresist 153 on top of the chrome layer 151. An acid bath is then used to etch away the chrome in positions where the chrome is not covered by the photoresist pads 153. The result is the structure shown in FIG. 2c. The chrome pads 154 act as an adhesion promoter between the photoresist pads 153 and the substrate 150. Photoresist heat flowing is then used to cause the photoresist pads 153 to flow, thereby creating dome shapes on top of the chrome pads as shown in FIG. 2d. As shown in FIG. 2e, a glass substrate 156 is placed in contact with liquid photopolymer 57 which is in contact with the structure of FIG. 2d. The structure is then exposed to ultraviolet light which causes inverted dome shapes to be created in the cured photopolymer 157. The master is comprised of layers 156 and 157 shown in FIG. 2f. FIG. 2f also shows how an embossment can be made from the master by using the soft embossing procedure described above with respect to FIGS. 1d and 1e. A piece of glass 160 is placed in contact with liquid photopolymer 161 which is in contact with layer 157. This structure is then exposed to ultraviolet light thereby causing photopolymer 161 to harden. The master and the embossment are then separated and the result is the embossment 162 shown in FIG. 2g.

Figure 5A:
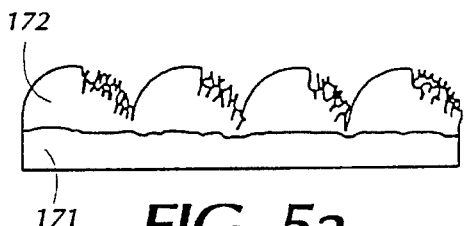
FIGS. 5a–5c illustrate cross-sectional views of the light control material of the present invention having light traps formed at selected locations in the material.
Figure 5B:
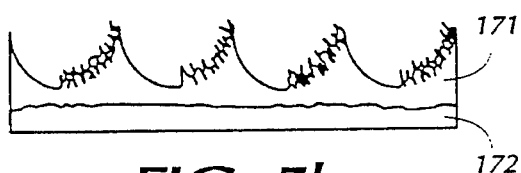
Figure 5C:
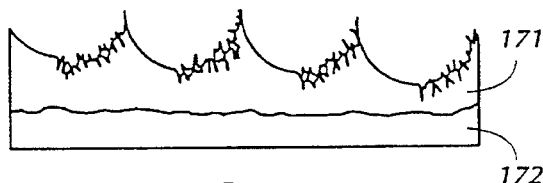

Once the embossment is made, the light trap can be formed directly therein by using the photolithographic techniques discussed above with respect to FIGS. 1a–1c to expose selected areas of the photopolymer embossment and then reactively ion etching the exposed areas to obtain a result such as that shown in FIG. 5a. FIG. 5b illustrates what an embossment would look like if the structure in FIG. 5a was used as the master. FIG. 5c illustrates the effect of reactive ion etching an inverted domed structure.

Figure 7:
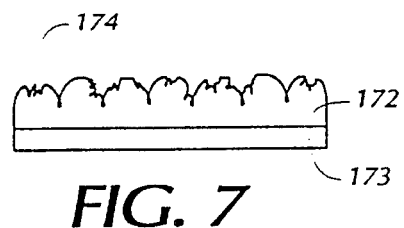
FIG. 7 illustrates a cross-sectional view of the light control material of the present invention in which the light control material has light traps selectively formed therein such that the material displays a black-and-white image.

FIG. 7 illustrates one embodiment for creating a light control material which displays a black-and-white image in accordance with the present invention. The photolithographic techniques described above with reference to FIGS. 1a–1c are used to expose selected areas in the photopolymer and reactive ion etching is used to create light traps 174 at the selected locations in photopolymer layer 172. The structure of FIG. 7 may then be used as a master from which embossments can be generated by using the soft embossing procedure discussed above with respect to FIGS. 1d and 1e and 2e and 2f.

In creating the light control material shown in FIG. 7, either a photographic negative or a computer-generated mask is used as the mask during exposure of the photoresist. When a photographic negative is used, the photoresist will be exposed in areas which correspond to clear areas in the negative (i.e., dark areas in the photographic positive). In areas in which the photoresist has been developed away, the chrome layer is etched with an acid bath thereby leaving the photopolymer layer exposed in certain locations in preparation for the reactive ion etching step. Reactive ion etching is then used to create light traps in the photopolymer layer. During reactive ion etching, the chrome layer serves as a mask. After reactive ion etching the remainder of the chrome layer is stripped away. The photopolymer layer having light traps formed therein constitutes a master from which embossments can be produced. An embossment can be generated from the master by the soft embossing procedure discussed above. The surface of the embossment having light traps selectively formed therein is coated with a reflective layer of metal such as aluminum to give it the desired reflective and light absorbing characteristics. The embossment displays a black-and-white image in accordance with the photographic negative or computer-generated mask, whichever was used in creating the master.

Figure 8A:
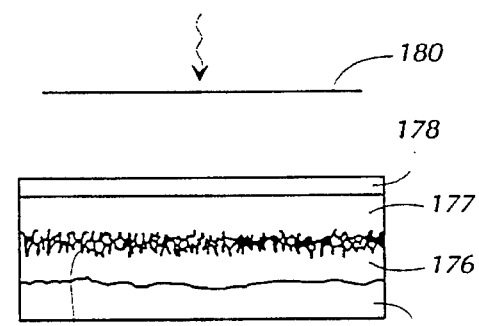
FIGS. 8a and 8b illustrate one embodiment for creating an embossed light control material which displays a black-and-white image.
Figure 8B:

FIG. 8a illustrates an alternative embodiment for creating an embossment which displays a black-and-white image. The master may be comprised of a glass substrate 175 and cured photopolymer 176, which has been reactively ion etched such that tapered structures 168 are formed throughout its entire surface. The master comprised of layers 175 and 176 is placed in contact with liquid photopolymer 177 which is in contact with a substrate 178 such as glass. The liquid photopolymer 177 is then exposed to ultraviolet light through mask 180 which is a photographic negative or computer-generated mask. The master is then separated from the embossment and the uncured photopolymer is washed away. The result is the embossment shown in FIG. 8b. The surface of the embossment comprising the light traps is preferably coated with a reflective layer of metal such as aluminum to provide the embossment with the desired reflective and light-absorbing characteristics.

Figure 9A:
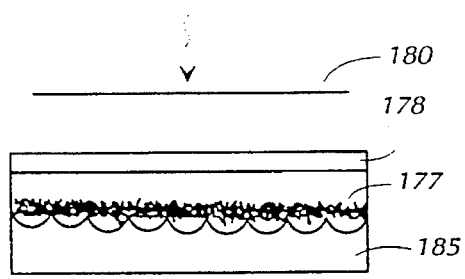
FIGS. 9a and 9b illustrate an alternative embodiment for creating an embossed light control material which displays a black-and-white image.
Figure 9B:
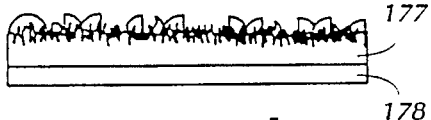

FIG. 9a shows an alternative embodiment for creating an embossment which displays a black-and-white image. A master 185 having inverted dome shapes formed therein is placed in contact with an embossment comprised of glass substrate 178 and a cured photopolymer layer having tapered structures 177 formed throughout its surface. Liquid photopolymer is disposed in the domed spaces between the master and the embossment. The liquid photopolymer is then exposed to ultraviolet light through mask 180 which may be a photographic positive or a computer-generated mask. Wherever the photopolymer is exposed to ultraviolet light, domed-shaped structures will be formed on the embossment such that, in the exposed areas, the light traps are covered by the domed-shaped structures. The resulting embossment is shown in FIG. 9b. When the surface of photopolymer layer 177 is covered with a reflective layer of metal such as aluminum, the domed or arcuate shaped elements will reflect light and the light traps will absorb light, thereby providing a black-and-white image.

FIG. 10a illustrates another embodiment for creating an embossment which displays a black-and-white image. This embodiment is a variation of the embodiment shown in FIGS. 9a and 9b. In this embodiment, the master is comprised of substrate 175 and photopolymer layer 176 having the tapered structures formed throughout its surface. The master is placed in proximity to an embossment comprised of a glass substrate 187 which is bonded to photopolymer layer 188 having domed shapes formed therein. Liquid photopolymer is placed between the master and the embossment and exposed to ultraviolet light through mask 180 which can be a photographic negative or a computer-generated mask. In areas in which the liquid photopolymer is exposed to the ultraviolet light, a light trap will be formed on the domed shaped reflectors of the embossment, as illustrated in FIG. 10b. The embossment shown in FIG. 10b is coated with a reflective layer of metal on its upper surface 186.

FIG. 11 illustrates an alternative embodiment in which an embossment which displays a black-and-white image can be converted to display a color image. The embossment which carries the black-and-white image can be generated in accordance with any of the embodiments discussed above. The substrate 190 of the embossment can be overlaid with color transparencies 192 and 193 which can be additive or subtractive. The black-and-white image, formed by generating light traps 189 in polymer layer 197, combination with the color transparencies produces a color image.

In accordance with the present invention, high resolution black and white images can be created. Generally, the present invention allows a black and white image to be created with a resolution of at least 2000 dots per inch. By overprinting the high resolution black and white image with a low resolution transparent color ink image, a high resolution color image is produced. As shown in FIG. 12, an embossment 201 has a high resolution black and white image formed therein as indicated by light traps 207. The printed color image may be comprised of any color images that can be printed by printers, such as cyan, magenta and yellow, for example The human eye has difficulty perceiving color edges without contrast. In accordance with the present invention, contrast is provided by a high resolution black and white embossed image. When the high resolution black and white embossed image is overprinted with transparent ink, the effect of a high resolution color image is created.

As discussed above, an embossed black and white image can be produced by placing a master which is comprised of a substrate and a cured polymer layer in contact with a layer of liquid photopolymer and exposing the liquid photopolymer to ultraviolet light. Alternatively, a metal embossing master may be created from any of the photopolymer masters by electroforming. For example, the master shown in FIG. 7 may be coated with a thin layer of metal, such as silver, by vapor deposition in order to render it electrically conductive. Electrical contact is then made to the metal surface and a layer of nickel is deposited onto the surface by conventional electroforming processes. After deposition of a sufficient thickness of nickel, the nickel plated photopolymer layer is removed from the electroplating bath and the nickel master is separated form the photopolymer layer. Embossments may then be generated from the nickel master by the soft embossing procedure discussed above with respect to FIG. 1d.

FIGS. 13a–13c illustrate an alternative embodiment for creating the light control material of the present invention wherein the light control material is intended to operate in the transmissive mode. As shown in FIG. 13a, a substrate such as glass or quartz 216, has a field of tapered structures 218 formed on its surface by any of the methods discussed above. The tapered structures 218 are covered with a layer of metal 214 which is covered with a layer of photoresist 212. The layer of photoresist 212 is exposed to ultraviolet light through mask 210 and the exposed areas are developed away, as shown in FIG. 13b. The resulting photoresist pads 220 shield metal layer 214 during a wet etching step such that only the uncovered portions of metal layer 214 are etched. During the wet etching step an acid is used to etch through the metal layer 214 and through the tapered structures located below the etched portions of the metal layer. The resulting structure is shown in FIG. 13c. The structure in FIG. 13c functions in the same manner as that shown in FIG. 8b when it is covered with a reflective material. The structure of FIG. 13c can also function in the transmissive mode wherein light passes through the structure to create a black and white image. The tapered structures 222 function as light traps by absorbing light which impinges on them. In this embodiment, the surface shown in FIG. 13c is not coated with a reflective material. However, the tapered structures 222 may be coated with a reflective material to enhance their light absorbing characteristics.

As shown in FIG. 14, the structure of FIG. 13c is capable of operating in the transmissive mode to produce a color image by placing additive or substractive color transparencies 225 and 226 in contact therewith or by overprinting the black and white image with a transparent color ink image. In essence, the structure of FIG. 13c can be used to produce color images in the same manner that the structures of FIGS. 11 and 12 are used to produce color images, with the exception that the structure of FIG. 13c may be operated in the transmissive mode.

Preferably, NOA 61 photopolymer is used to create the light control material of the present invention. Although this type of photopolymer was found through experimentation to be suitable for use with the present invention, it is possible that other types of photopolymers may also be suitable for such use. Shipley 1800 Series photoresist is preferably used to create the light control material of the present invention but other types of photoresist may be suitable for use with the present invention.

While the invention has been disclosed in preferred forms, it will be apparent to those skilled in the art that many modifications can be made to the invention without departing from the spirit and scope of the invention. For example, the present invention is not limited with respect to the types of materials used to create the masters or embossments. Any materials which have the desired physical and optical properties may be used with the present invention. The embossments may also be generated by extrusion embossing wherein a molten extrudate is placed in contact with the master. When the extrudate cools it hardens and the resulting embossment is separated from the master.

We claim:

1. A light control material comprising:
   a polymer layer having at least one light trap formed therein wherein said at least one light trap is comprised of a plurality of tapered structures which have relatively high aspect ratios and wherein said tapered structures are covered with a reflective material such that light entering said at least one light trap is reflected within said at least one light trap among the tapered structures until substantially all of the light which has entered said at least one light trap has been absorbed.

2. A light control material according to claim 1 wherein said at least one light trap is created by reactively ion etching said polymer layer to thereby form the tapered structures and by coating said tapered structures with metal to form said reflective layer.

3. A light control material according to claim 1 wherein said light control material is an embossment generated from a master by a soft embossing procedure.

4. A light control material for displaying a black- and-white image, said light control material comprising:
   a polymer layer having a plurality of reflective areas and light traps formed therein, each of said light traps comprising a plurality of tapered structures, wherein said tapered structures have relatively high aspect ratios and wherein said reflective areas and said light traps are covered with a reflective material whereby light impinging on the reflective areas is reflected and light entering the light traps is reflected within the light traps among the tapered structures until substantially all of the light which has entered the light traps has been absorbed.

5. A light control material for displaying a black-and-white image according to claim 4 wherein said light control material is an embossment generated from a master by a soft embossing procedure and wherein said light traps formed in said embossment correspond to light traps formed in said master.

6. A light control material for displaying a black-and-white image according to claim 4 wherein said light traps are created by reactively ion etching said polymer layer to thereby form the tapered structures and by coating said tapered structures with metal to form said reflective layer.

7. A light control material for displaying a black-and-white image according to claim 5 wherein the light traps formed in the master are formed in selected locations in the master, and wherein said locations are selected in accordance with a photographic negative.

8. A light control material for displaying a black-and-white image according to claim 5 wherein the light traps formed in the master are formed in selected locations in said master, wherein said locations are selected in accordance with a computer-generated mask.

9. A light control material for displaying a color image, said light control material comprising:

a polymer layer having a plurality of reflective areas and light traps formed therein, each of said light traps comprising a plurality of tapered structures, wherein said tapered structures have relatively high aspect ratios and wherein said reflective areas and said light traps are covered with a reflective material whereby light impinging on the reflective areas is reflected and light entering the light traps is reflected within the light traps among the tapered structures until substantially all of the light which has entered the light traps has been absorbed, and wherein said polymer layer displays a black-and-white image, wherein the light traps provide the black in the black-and-white image and wherein the reflective areas provide the white in the black-and-white image; and at least one color transparency overlaying said polymer layer, wherein said color transparency converts the black-and-white image into a color image.

10. A light control material for displaying a color image according to claim 9 wherein said light control material is an embossment generated from a master by a soft embossing procedure and wherein said light traps formed in said embossment correspond to light traps formed in said master.

11. A light control material for displaying a color image according to claim 10 wherein the light traps formed in the master are formed in selected locations in said master, wherein said locations are selected in accordance with a photographic negative.

12. A light control material for displaying a color image according to claim 10 wherein the light traps formed in the master are formed in selected locations in said master, wherein said locations are selected in accordance with a computer-generated mask.

13. A light control material for displaying a color image, said light control material comprising:

a polymer layer having a plurality of reflective areas and light traps formed therein, each of said light traps comprising a plurality of tapered structures, wherein said tapered structures have relatively high aspect ratios and wherein said reflective areas and said light traps are covered with a reflective material whereby light impinging on the reflective areas is reflected and light entering the light traps is reflected within the light traps among the tapered structures until substantially all of the light which has entered the light traps has been absorbed, and wherein said polymer layer displays a black-and-white image, wherein the light traps provide the black in the black-and-white image and wherein the reflective areas provide the white in the black-and-white image and wherein said polymer layer is overprinted with transparent color ink, and wherein said color transparent ink converts the black and white image into a color image.

14. A light control material for displaying a color image according to claim 13 wherein said light control material is an embossment generated from a master by a soft embossing procedure and wherein said light traps formed in said embossment correspond to light traps formed in said master.

15. A light control material for displaying a color image according to claim 14 wherein the light traps formed in the master are formed in selected locations in said master, wherein said locations are selected in accordance with a photographic negative.

16. A light control material for displaying a color image according to claim 14 wherein the light traps formed in the master are formed in selected locations in said master, wherein said locations are selected in accordance with a computer-generated mask.

17. A light control material for displaying a black-and-white image, said light control material comprising:

a substantially clear substrate having a surface on which light traps are formed in selected locations, wherein each of said light traps is comprised of a plurality of tapered structures, wherein said tapered structures have relatively high aspect ratios and wherein light entering the light traps is reflected within the light traps among the tapered structures until substantially all of the light which has entered the light traps has been absorbed.

18. A light control material for displaying a black-and-white image according to claim 17 wherein at least said light traps are covered with a reflective material.

19. A light control material for displaying a black-and-white image according to claim 17 wherein said surface and said light traps are covered with a reflective material.

* * * * *